(12) United States Patent
Chang et al.

(10) Patent No.: US 8,236,702 B2
(45) Date of Patent: *Aug. 7, 2012

(54) METHOD OF FABRICATING OPENINGS AND CONTACT HOLES

(75) Inventors: Feng-Yi Chang, Chiayi County (TW); Pei-Yu Chou, Tainan County (TW); Jiunn-Hsiung Liao, Tainan Hsien (TW); Chih-Wen Feng, Tainan County (TW); Ying-Chih Lin, Tainan (TW); Po-Chao Tsao, Taipei Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 1190 days.

This patent is subject to a terminal disclaimer.

(21) Appl. No.: 12/042,340

(22) Filed: Mar. 5, 2008

(65) Prior Publication Data

US 2008/0153295 A1 Jun. 26, 2008

Related U.S. Application Data

(63) Continuation-in-part of application No. 11/163,149, filed on Oct. 6, 2005.

(51) Int. Cl.
*H01L 21/302* (2006.01)
(52) U.S. Cl. ......... 438/740; 438/714; 438/742; 438/743
(58) Field of Classification Search .................. 438/243, 438/639, 700, 702, 740, 742, 743, 744
See application file for complete search history.

(56) References Cited

U.S. PATENT DOCUMENTS

| 6,093,641 A | 7/2000 | Park |
| 6,306,759 B1 | 10/2001 | Yen |
| 6,432,814 B1 | 8/2002 | Steiner |
| 6,492,263 B1 * | 12/2002 | Peng et al. ............ 438/639 |
| 6,569,760 B1 | 5/2003 | Lin |
| 6,645,857 B1 | 11/2003 | Whitefield |
| 6,713,310 B2 | 3/2004 | Song |
| 7,112,506 B2 | 9/2006 | Kim |
| 7,256,502 B2 * | 8/2007 | Chung ............ 257/774 |
| 7,825,034 B2 * | 11/2010 | Tsao et al. ............ 438/740 |
| 7,829,410 B2 | 11/2010 | Plum |

(Continued)

FOREIGN PATENT DOCUMENTS

CN 1337740 A 2/2002

(Continued)

OTHER PUBLICATIONS

Wen Zheng Han et al., "Dielectrics barrier layer of contact for narrow contact hole", Invention Disclosure, Jun. 21, 2004, p. 1-2.

*Primary Examiner* — Lan Vinh
(74) *Attorney, Agent, or Firm* — Winston Hsu; Scott Margo

(57) ABSTRACT

A semiconductor substrate having an etch stop layer and at least a dielectric layer disposed from bottom to top is provided. The dielectric layer and the etching stop layer is then patterned to form a plurality of openings exposing the semiconductor substrate. A dielectric thin film is subsequently formed to cover the dielectric layer, the sidewalls of the openings, and the semiconductor substrate. The dielectric thin film disposed on the dielectric layer and the semiconductor substrate is then removed while the dielectric thin film disposed on the sidewalls remains.

10 Claims, 10 Drawing Sheets

U.S. PATENT DOCUMENTS

| | | |
|---|---|---|
| 2003/0013253 A1 | 1/2003 | Hurley |
| 2003/0119271 A1 | 6/2003 | Aggarwal |
| 2004/0018712 A1* | 1/2004 | Plas et al. ............ 438/612 |
| 2004/0067616 A1 | 4/2004 | Hachisuka |
| 2004/0169224 A1 | 9/2004 | Ebihara |
| 2004/0203176 A1 | 10/2004 | Zhao |
| 2005/0074965 A1* | 4/2005 | Lee et al. ............ 438/627 |
| 2005/0142862 A1* | 6/2005 | Chun ............ 438/639 |
| 2007/0059885 A1 | 3/2007 | Hachisuka |
| 2007/0210454 A1 | 9/2007 | Chou |
| 2008/0157224 A1 | 7/2008 | Fischer |
| 2008/0251850 A1 | 10/2008 | Bu |
| 2008/0251855 A1 | 10/2008 | Besser |
| 2009/0001453 A1 | 1/2009 | Richter |
| 2009/0068833 A1 | 3/2009 | Choi |
| 2009/0321837 A1 | 12/2009 | Wei |

FOREIGN PATENT DOCUMENTS

| | | |
|---|---|---|
| CN | 1519953 A | 8/2004 |

* cited by examiner

METHOD OF FABRICATING OPENINGS AND CONTACT HOLES

CROSS REFERENCE TO RELATED APPLICATIONS

This is a continuation-in-part of U.S. patent application Ser. No. 11/163,149 filed Oct. 6, 2005.

BACKGROUND OF THE INVENTION

1. Field of the Invention

The present invention pertains to a method of fabricating openings, and more particularly, to a method of forming openings such as contact holes, via holes, and trenches, capable of preventing polymer residues and contact-to-contact bridge.

2. Description of the Prior Art

The trend to micro-miniaturization, or the ability to fabricate semiconductor devices with feature size smaller than 0.065 micrometers, has presented difficulties when attempting to form contact holes (especially for high aspect ratio contact holes) in a dielectric layer to expose underlying conductive regions.

Please refer to FIGS. 1-4. FIGS. 1-4 are schematic, cross-sectional diagrams showing the process of forming contact holes in accordance with the prior art method. As shown in FIG. 1, a metal-oxide-semiconductor (MOS) transistor device 20 is formed on a semiconductor substrate 10. The MOS transistor device 20, which is isolated by shallow trench isolations (STIs) 24, includes source/drain regions 12, a gate electrode 14, and a spacer structure 16 disposed on the sidewalls of the gate electrode 14. The semiconductor substrate 10 further includes a contact etch stop layer (CESL) 32 deposited over the MOS transistor device 20 and the semiconductor substrate 10, and an inter-layer dielectric (ILD) layer 34 deposited on the CESL 32. Subsequently, a bottom anti-reflective coating (BARC) layer 36 is deposited on the ILD layer 34. Then, a photoresist layer 40 is formed on the BARC layer 36, and a conventional exposure-and-development process is carried out to form openings 42 in the photoresist layer 40 to define the locations of contact holes to be formed later.

As shown in FIG. 2, using the photoresist layer 40 as an etching hard mask to etch the exposed BARC layer 36 and the ILD layer 34 through the openings 42 so as to form openings 44. The etching of the ILD layer 34 stops on the CESL 32. Subsequently, as shown in FIG. 3, using the remaining photoresist layer 40 and the BARC layer 36 as an etching hard mask to etch the exposed CESL 32 through the openings 44, thereby forming contact holes 46. As shown in FIG. 4, the remaining photoresist layer 40 and the BARC layer 36 over the ILD layer 34 are removed.

The above-described prior art method of forming contact holes has several drawbacks. First, when etching the CESL 32, the contact profile is also impaired due to the low etching selectivity between the ILD layer 34 and the CESL 32. Second, the ILD layer 34 and the underlying CESL 32 are etched in-situ, without removing the photoresist layer 40. The polymer residue produced during the etching of the ILD layer 34 and the CESL 32 results in a tapered profile of the contact hole 46, thereby reducing the exposed surface area of the source/drain regions 12 and increasing the contact sheet resistance.

In addition to the above problems, when the feature size is reduced to 0.045 micrometers or less, the CESL 32 disposed in between two adjacent gate electrodes 14 tends to merge, and causes seam issue. Under such a condition, the plug metal e.g. tungsten, which is filled into the contact hole 44 successively will fill into the seam and lead to contact to contact bridge. Please refer to FIGS. 5-8. FIGS. 5-8 are schematic diagrams illustrating the seam issue and contact-to-contact bridge according to conventional method. FIGS. 5-8 are cross-sectional views, where FIG. 8 is a perpendicular cross-sectional view of FIG. 7. As shown in FIG. 5, a plurality of MOS transistor devices 20 are formed on a semiconductor substrate 10 in a SRAM region for instance. The MOS transistor devices 20 include source/drain regions 12 disposed in the semiconductor substrate 10 between two adjacent gate electrodes 14, and a spacer structure 16 disposed on the sidewalls of the gate electrode 14. The semiconductor substrate 10 further includes a CESL 32 deposited over the MOS transistor devices 20 and the semiconductor substrate 10, and an ILD layer 34 deposited on the CESL 32. As shown in FIG. 5, the CESL 32 disposed in between two adjacent gate electrodes 14 are merged in the deposition process due to the reduced feature size. This results in the generation of seam 33 in the CESL 32.

As shown in FIG. 6, a photoresist layer (not shown) is used as an etching hard mask to etch the ILD layer 34. The etching of the ILD layer 34 stops on the CESL 32. Subsequently, the exposed CESL 32 is etched, thereby forming contact holes 46. As shown in FIGS. 7 and 8, a metal layer 47, is filled into the contact holes 46 to form the contact plug. However, the metal layer also fills into the seam 33 and thus causes the short circuit between adjacent contact plugs. This phenomenon is referred to as contact-to-contact bridge.

In light of the above problems, there is a need in this industry to provide an improved method of fabricating contact holes in which the contact sheet resistance is reduced without affecting the contact hole profile formed in the ILD layer and in which the seam issue is prevented.

SUMMARY OF THE INVENTION

It is therefore one of the objects of the claimed invention to provide a method of fabricating openings to overcome the aforementioned problems.

According to the claimed invention, a method of fabricating openings is disclosed. The method includes: providing a semiconductor substrate comprising an etch stop layer and at least a dielectric layer disposed from bottom to top;

patterning the dielectric layer and the etching stop layer to form a plurality of openings in the dielectric layer and the etching stop layer, the openings partially exposing the semiconductor substrate;

forming a dielectric thin film covering the dielectric layer, sidewalls of the openings, and the exposed semiconductor substrate; and removing the dielectric thin film disposed on the dielectric layer and the semiconductor substrate.

According to the claimed invention, a method of fabricating contact holes is disclosed. The method includes:

providing a semiconductor substrate at least divided into a first device region and a second device region, the semiconductor substrate comprising an etch stop layer and at least a dielectric layer from bottom to top, the etch stop layer covering the first device region and exposing the second device region;

patterning the dielectric layer and the etching stop layer to form a plurality of contact holes in the dielectric layer and in the etching stop layer in the first device region and form a plurality of contact holes in the dielectric layer in the second device region, the contact holes formed in the first device region and in the second device region exposing the semiconductor substrate;

forming a dielectric thin film covering the dielectric layer, sidewalls of the contact holes, and the semiconductor substrate in the first device region and the second device region; and removing the dielectric thin film disposed on the dielectric layer, and the semiconductor substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
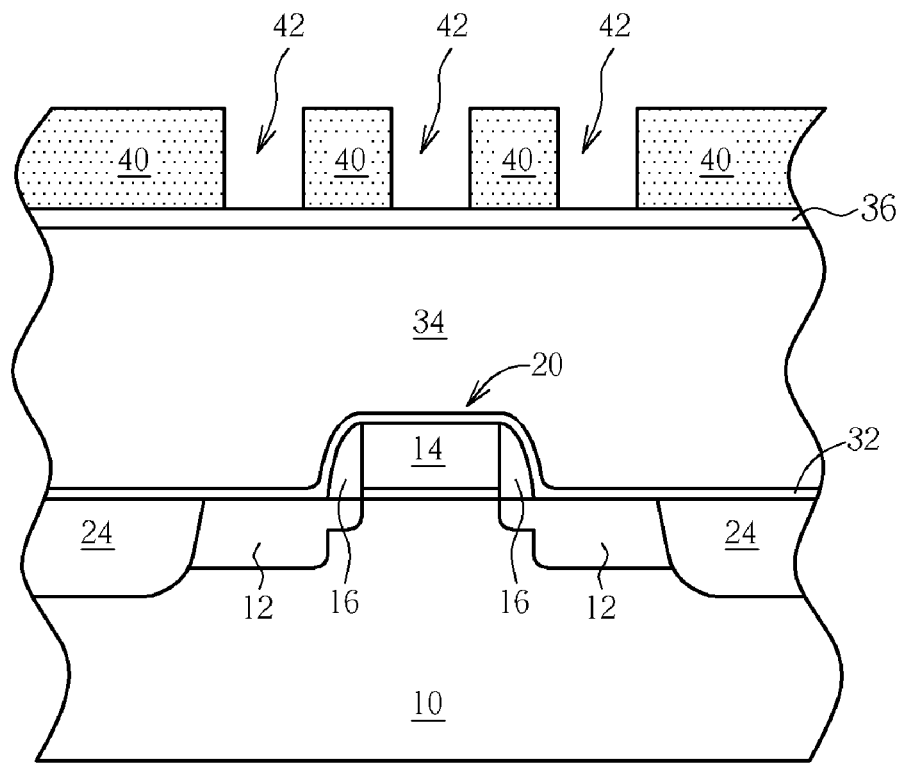
FIGS. 1-4 are schematic, cross-sectional diagrams showing the process of forming contact holes in accordance with the prior art method.
Figure 2:
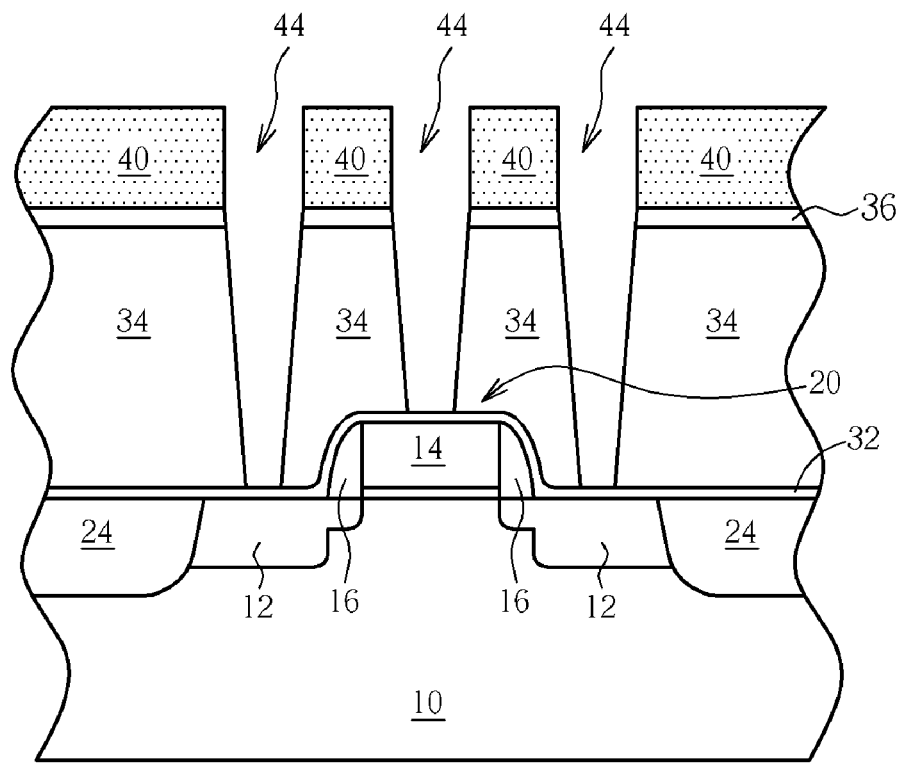
Figure 3:
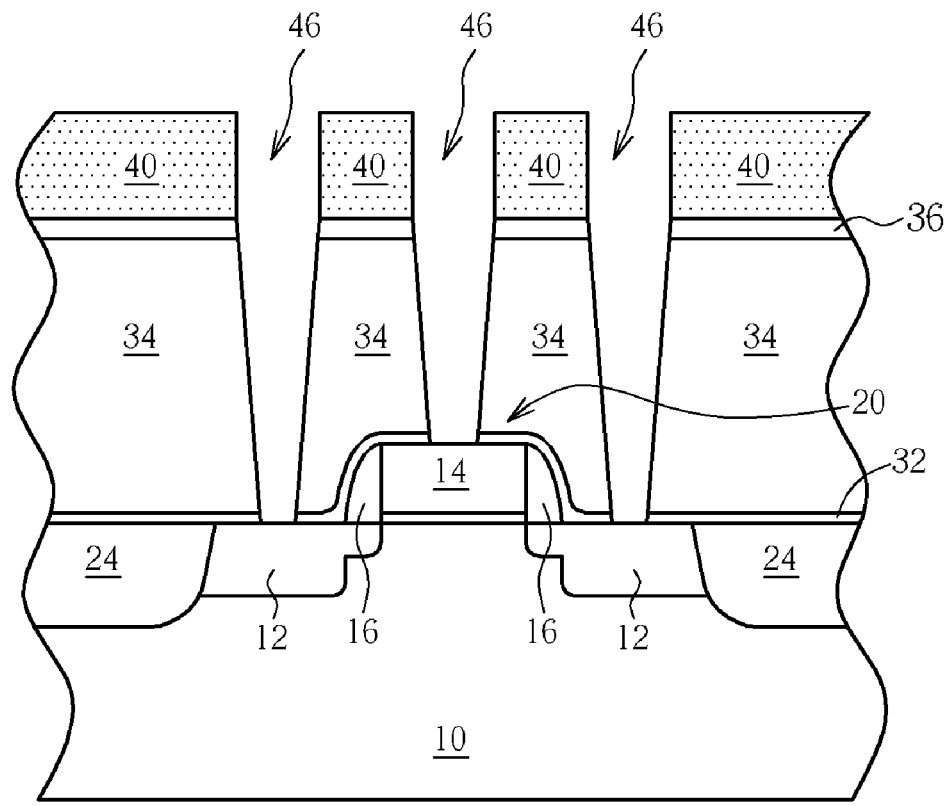
Figure 4:
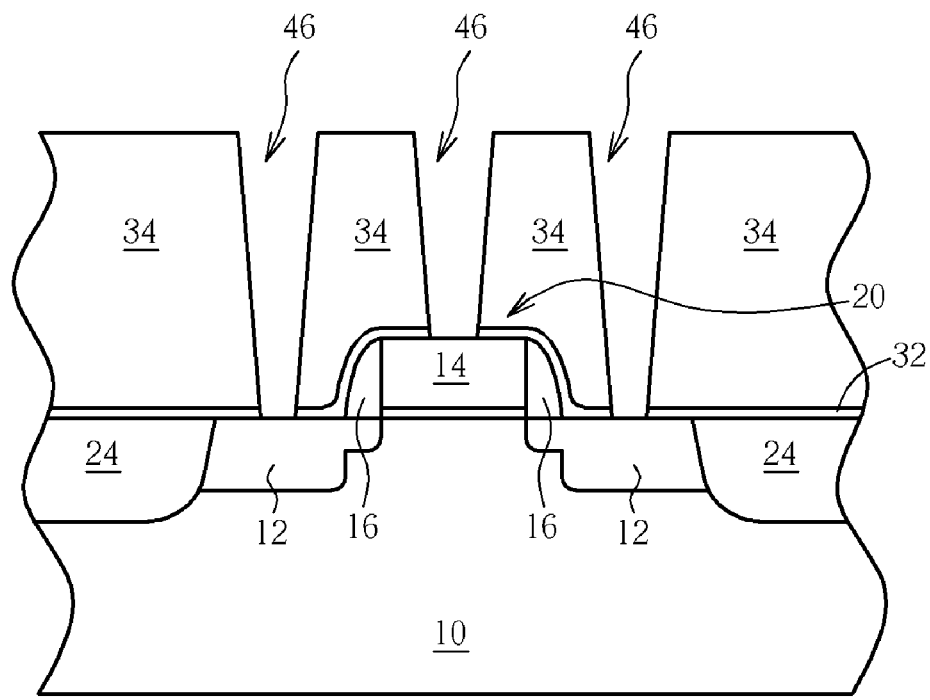
Figure 5:
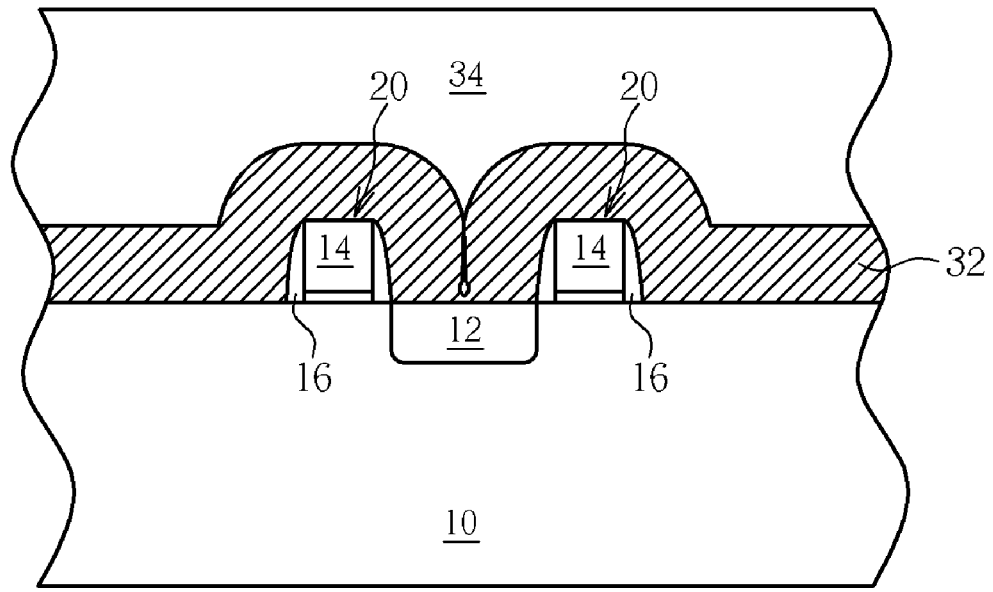
FIGS. 5-8 are schematic diagrams illustrating the seam issue and contact-to-contact bridge according to conventional method.
Figure 6:
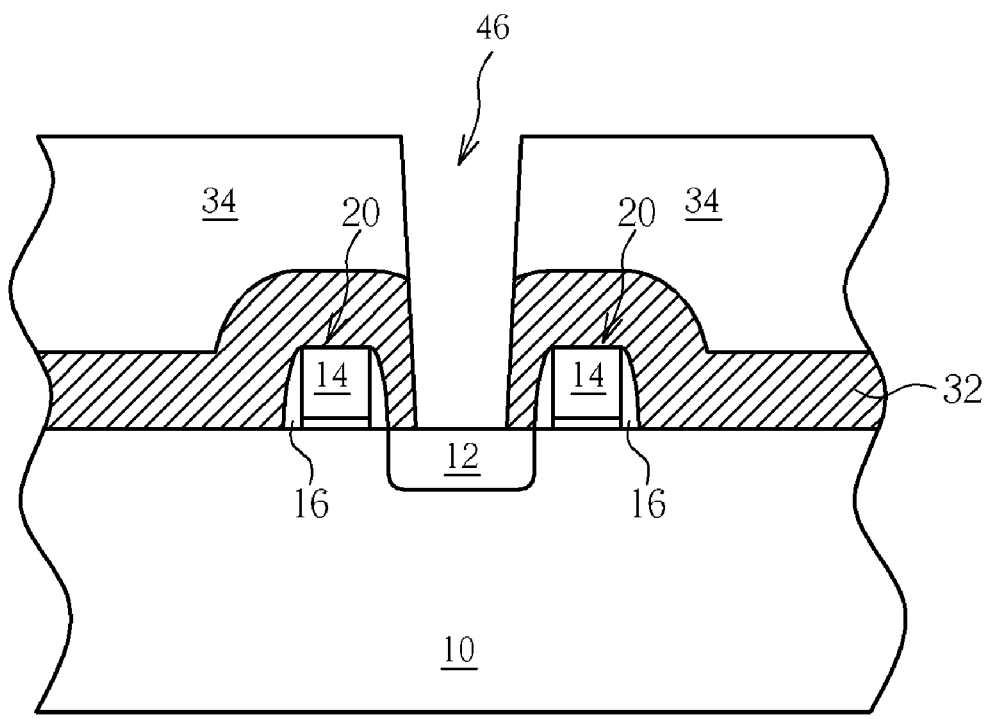
Figure 7:
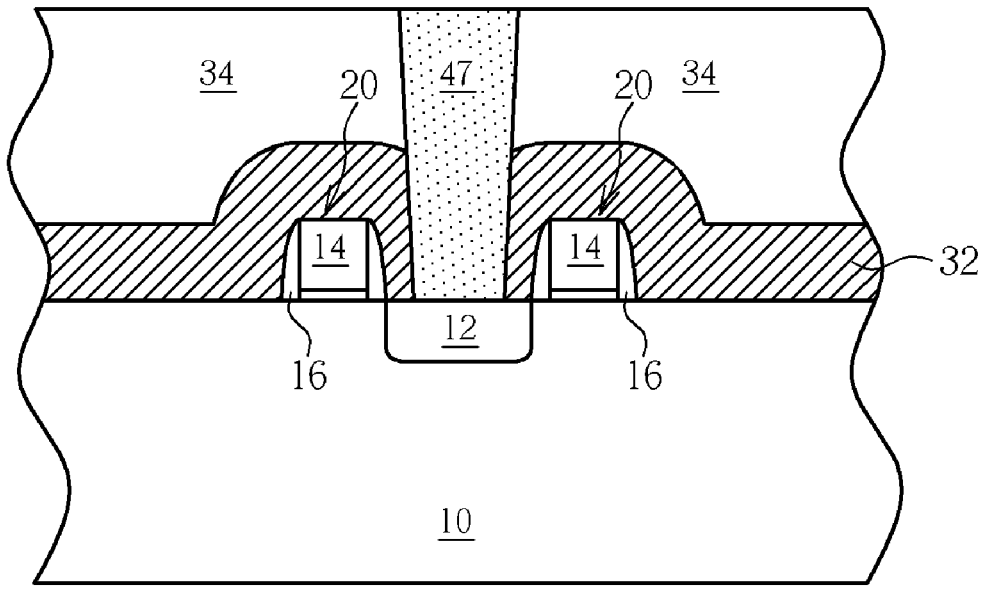
Figure 8:
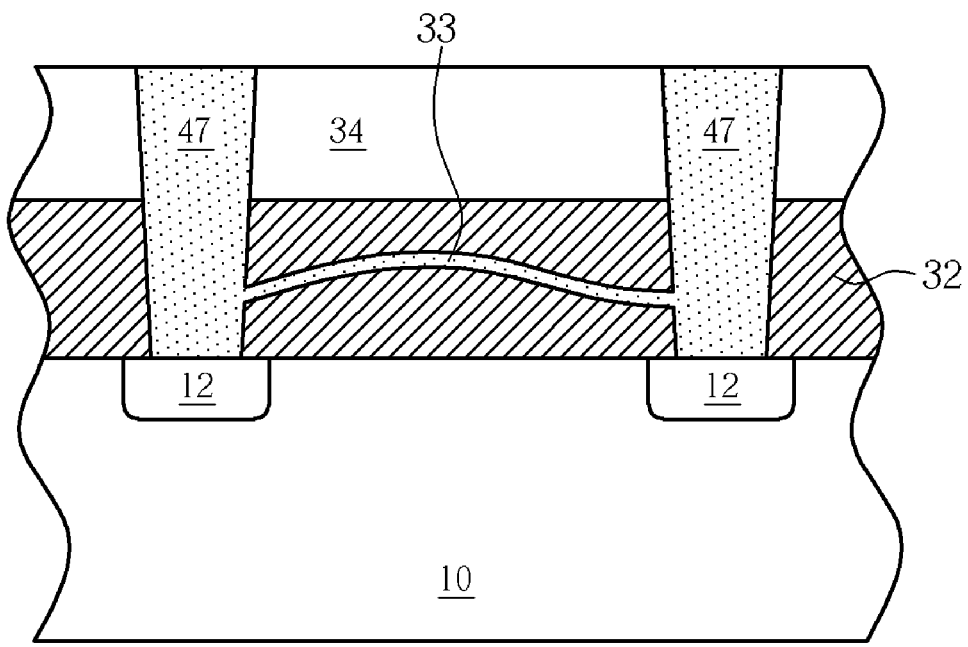
Figure 9:
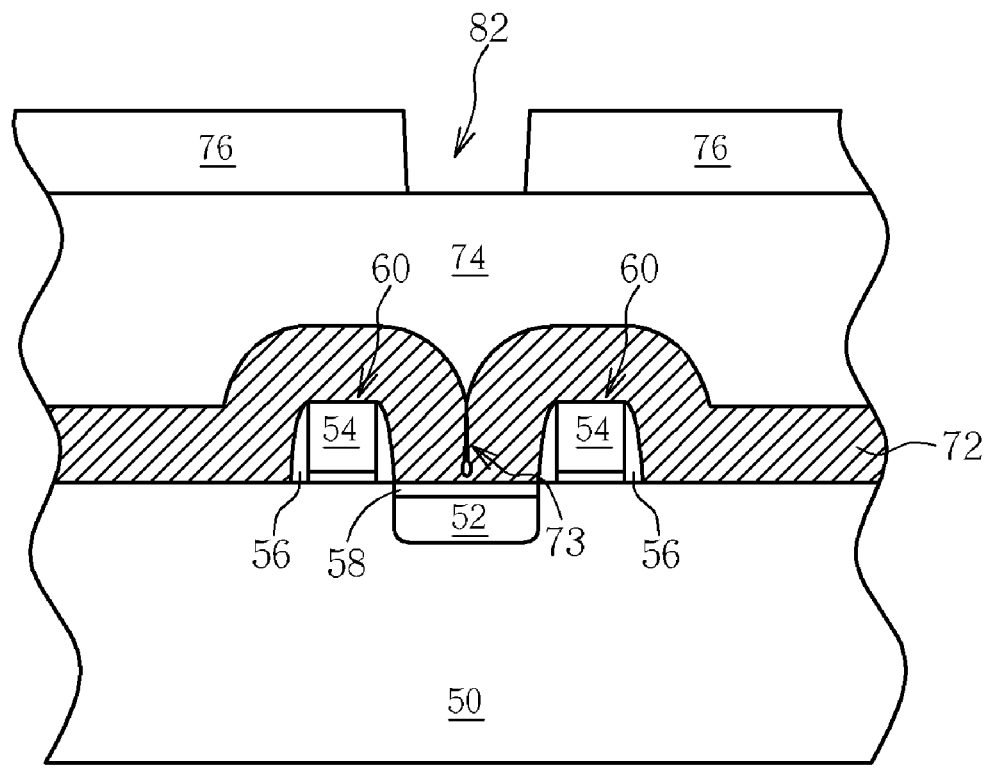
FIGS. 9-14 are schematic, cross-sectional diagrams illustrating a method of fabricating openings in accordance with a preferred embodiment of the present invention.
Figure 12:
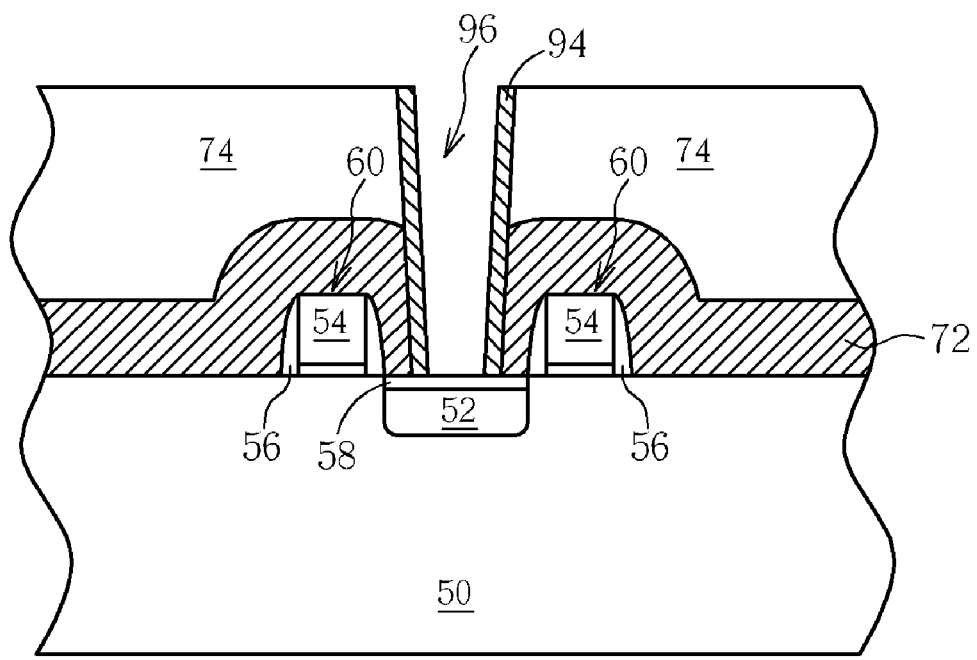
Figure 13:
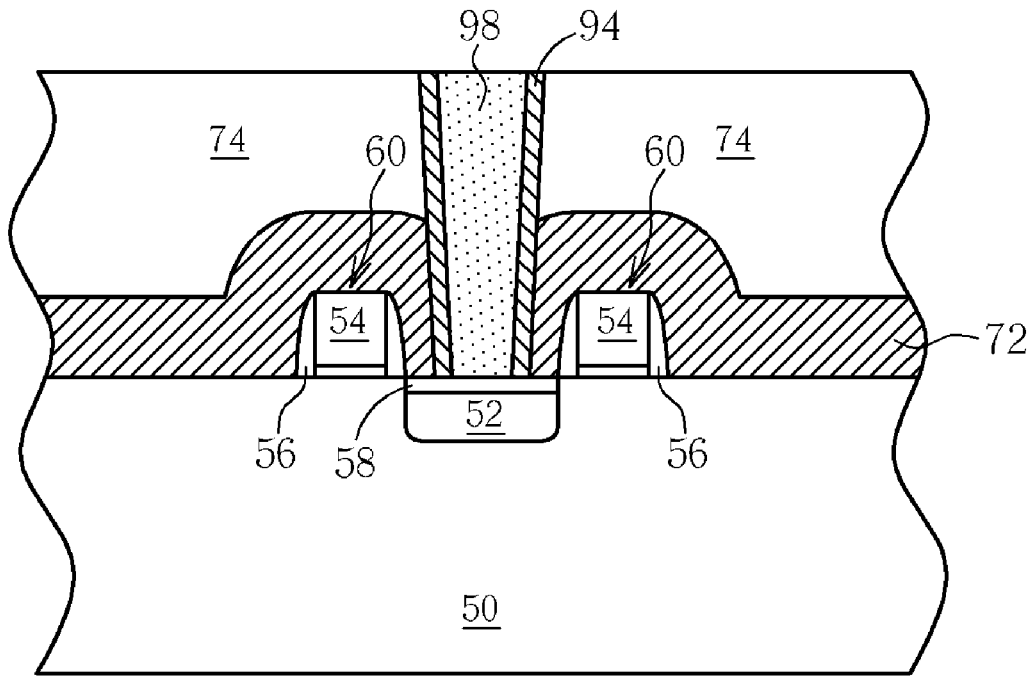
Figure 14:
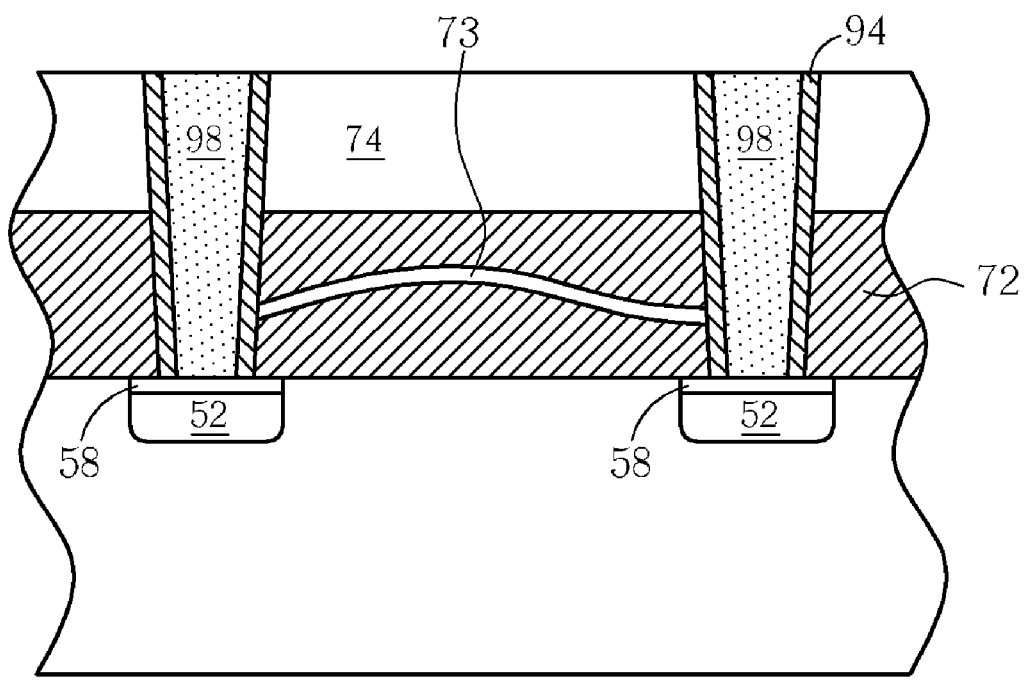

Please refer to FIGS. 9-14. FIGS. 9-14 are schematic, cross-sectional diagrams illustrating a method of fabricating openings in accordance with a preferred embodiment of the present invention. FIGS. 9-14 are cross-sectional views, where FIG. 14 is a perpendicular cross-sectional view of FIG. 13. In this embodiment, a method of forming contact holes in a SRAM region is exemplarily illustrated. As shown in FIG. 9, a plurality of MOS transistor devices 60 are formed on a semiconductor substrate 50. The MOS transistor devices 60 include gate electrodes 54, and spacer structures 56 disposed on the sidewalls of the gate electrodes 54, and source/drain regions 52 disposed in the semiconductor substrate 50 in between adjacent gate electrodes 54. The MOS transistor devices 60 may further include salicides 58 disposed on the surface of the gate electrode 54 and the source/drain regions 52. Subsequently, a contact etch stop layer (CESL) 72 is deposited over the MOS transistor device 60 and the semiconductor substrate 50, and an inter-layer dielectric (ILD) layer 74 is deposited on the CESL 72. As shown in FIG. 9, as the poly pitch gets smaller, the CESL 72 disposed between gate electrodes 54 tends to merge, thereby forming a seam 73.

Normally, the ILD layer 74 may includes tetraethylorthosilicate (TEOS) oxide, un-doped silicon glass, or doped silicon oxide such as borophosphosilicate glass (BPSG), FSG, PSG or BSG. The materials of the CESL 72 and the ILD layer 74 are not limited to the above materials. Plasma-enhanced chemical vapor deposition (PECVD) method or other deposition techniques may be used to deposit the ILD layer 74.

Subsequently, a mask layer 76 having a plurality of openings 82 is formed on the ILD layer 74. The openings 82 are disposed corresponding to the source/drain regions 52 so as to define the locations of contact holes. The mask layer 76 may include a photoresist layer, a metal layer, or a dielectric layer. Preferably, the mask layer 76 is a metal layer or a dielectric layer such as a silicon nitride layer, so as to prevent polymer residues generated in etching the ILD layer 74 and the CESL 72.

Figure 10:
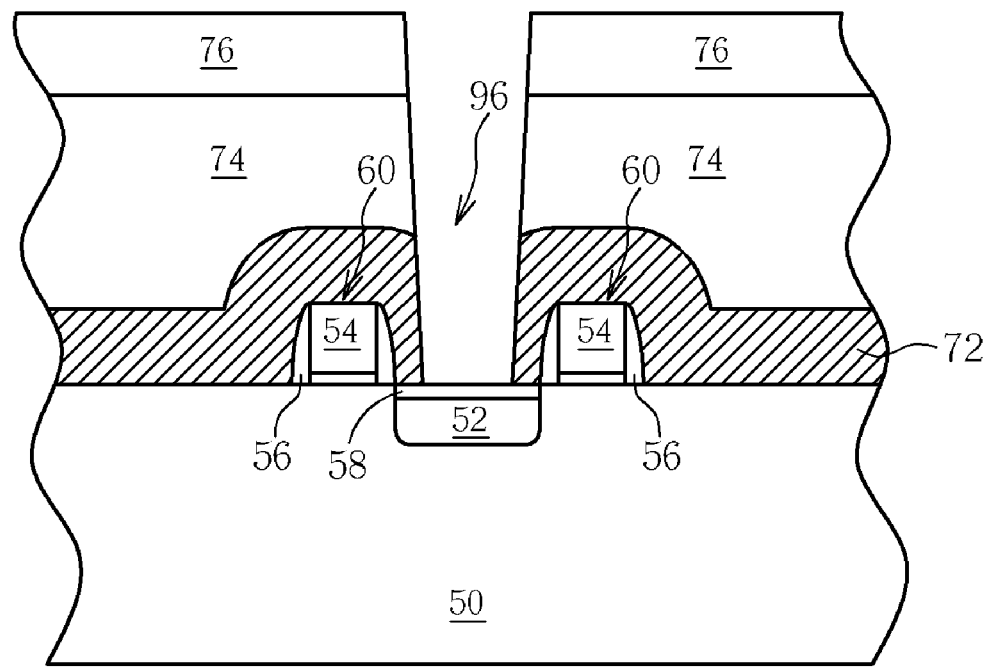
Figure 11:
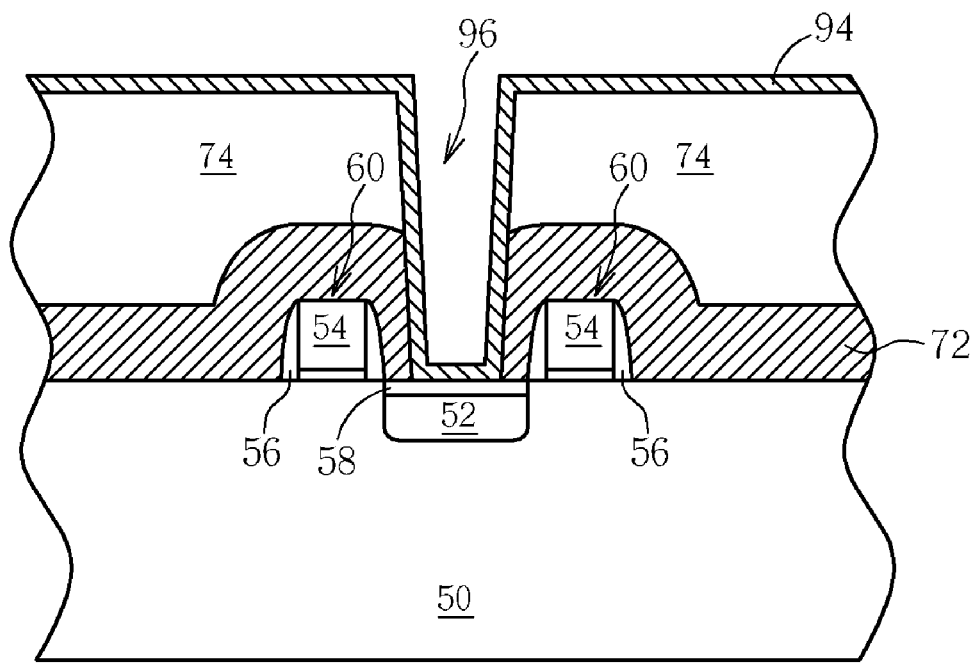

As shown in FIG. 10, at least an anisotropic etching process is performed using the mask layer 76 as an etching hard mask to etch the ILD layer 74 and the CESL 72 through the openings 82 to form a plurality of contact holes 96. The etching of the ILD layer 74 and the CESL 72 may be carried out by one etching process or more etching processes. The number of the etching process to be performed depends on the etching selectivity of the materials of the ILD layer 74 and the CESL 72. In etching the CESL 72, the mask layer 76 may be removed in advance, and the ILD layer 74 is used as the etching hard mask if necessary. It is to be appreciated that the CESL 72 in the contact holes 96 are etched thoroughly so as to expose the source/drain regions 52 or the salicides 58 of the semiconductor substrate 50 if salicides 58 were disposed. As shown in FIG. 11, the mask layer 76 is then removed, and a clean process is performed to remove polymer residues or particles remaining in the sidewalls of the contact holes 96. The clean process can be a wet clean process or a dry clean process, and can be performed in-situ or ex-situ. Then, a dielectric thin film 94 is formed on the ILD layer 74, the sidewalls of the contact holes 96, and the exposed semiconductor substrate 50. In this embodiment, the contact holes 96 to be formed has a feature size of between 50 and 100 nm (preferably 65 nm) but can be smaller e.g. less than 45 nm, and therefore the thickness of the dielectric thin film 94 is preferably between 0.5 to 10 nm. However, the thickness of the dielectric thin film 94 can be altered in accordance with different process feature size. The dielectric thin film 94 may include a silicon oxide thin film, a silicon nitride thin film, a silicon oxynitride thin film, etc. The dielectric thin film 94 may also be a high k material having a dielectric constant larger than 3.9. For instance, the dielectric thin film 94 may include tantalum oxide thin film, a titanium oxide thin film, a zirconium oxide thin film, a hafnium oxide thin film, hafnium silicon oxide thin film, hafnium silicon oxynitride, etc. The dielectric thin film 94 can be formed by different deposition techniques such as LPCVD, APCVD, PECVD, ALD, etc.

As shown in FIG. 12, an etch back process is performed to etch the dielectric thin film 94 disposed on the ILD layer 74 and the semiconductor substrate 50. Meanwhile, the dielectric thin film 94 disposed on the sidewalls of the contact holes 96 is reserved. It should be appreciated that at least a surface treatment may be carried out when the semiconductor substrate 50 is exposed. For instance, an implantation process can be performed to reduce the resistance of the source/drain regions 52. Or a clean process can be performed to clean the sidewalls of the contact holes 96 for improving the reliability of the contact plugs to be formed later.

As shown in FIGS. 13 and 14, a metal layer 98 e.g. a tungsten layer, is deposited to fill into the contact holes 96 as contact plugs. As shown in FIG. 14, since the terminals of the seam 73 are blocked by the dielectric thin film 94, the metal layer 98 will not enter the seam 73. Consequently, the contact-to-contact bridge problem is prevented.

Figure 15:
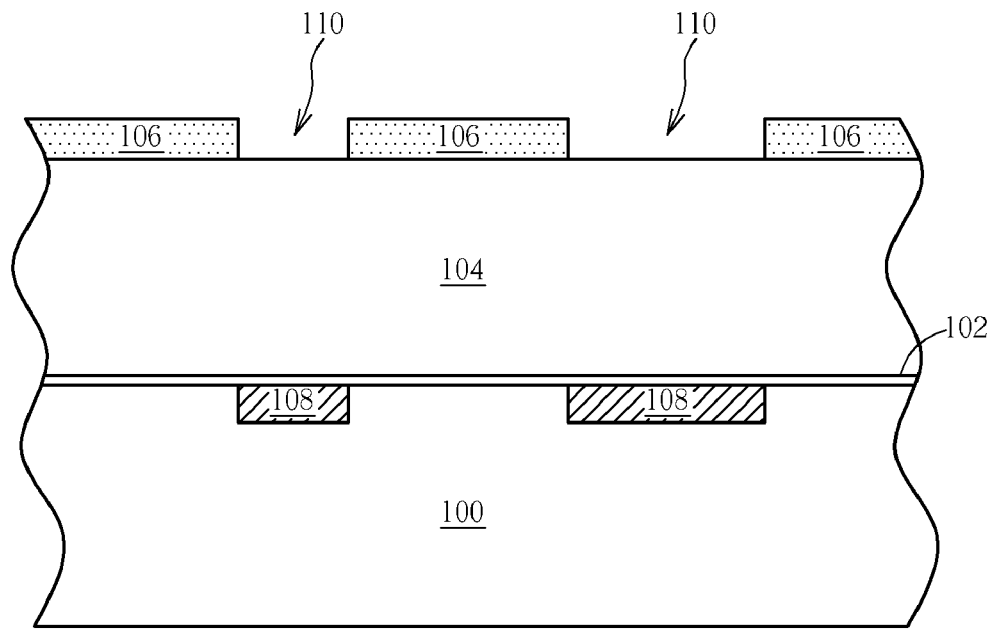
FIGS. 15-18 are schematic, cross-sectional diagrams illustrating a method of fabricating openings in accordance with another preferred embodiment of the present invention.

The method of the present invention is not limited to be applied to fabrications of contact holes, and can be adopted to form various openings such as via holes or trenches. Please refer to FIGS. 15-18. FIGS. 15-18 are schematic, cross-sectional diagrams illustrating a method of fabricating openings in accordance with another preferred embodiment of the present invention. As shown in FIG. 15, a semiconductor substrate 100 including an etch stop layer 102, a dielectric layer 104, and a mask layer 106 is provided. The semiconductor substrate 100 further has a conductive pattern 108, and the mask layer 106 includes a plurality of openings 110 disposed corresponding to the conductive pattern 108.

Figure 16:
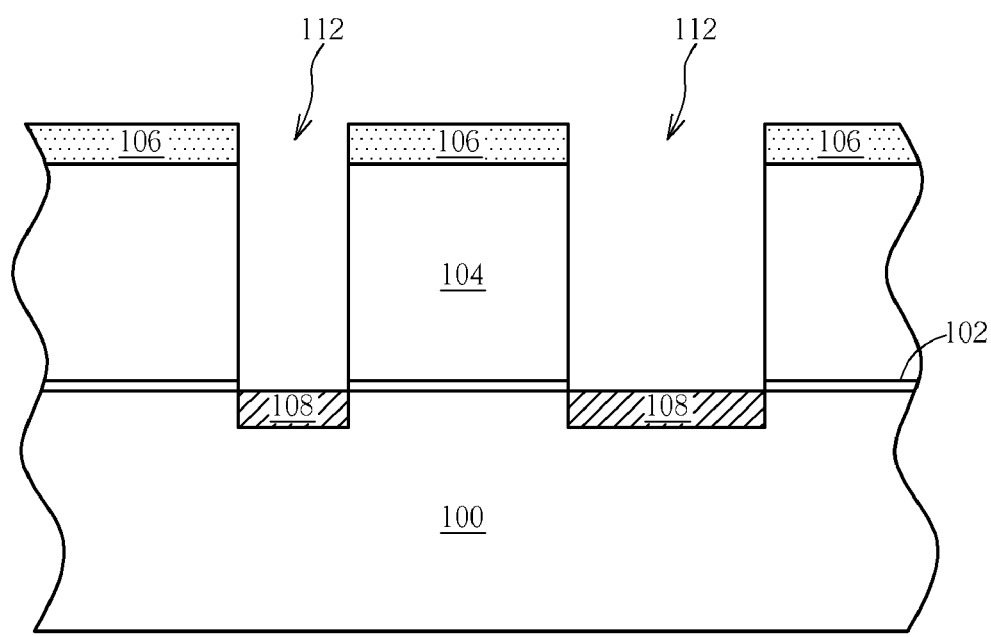
Figure 17:
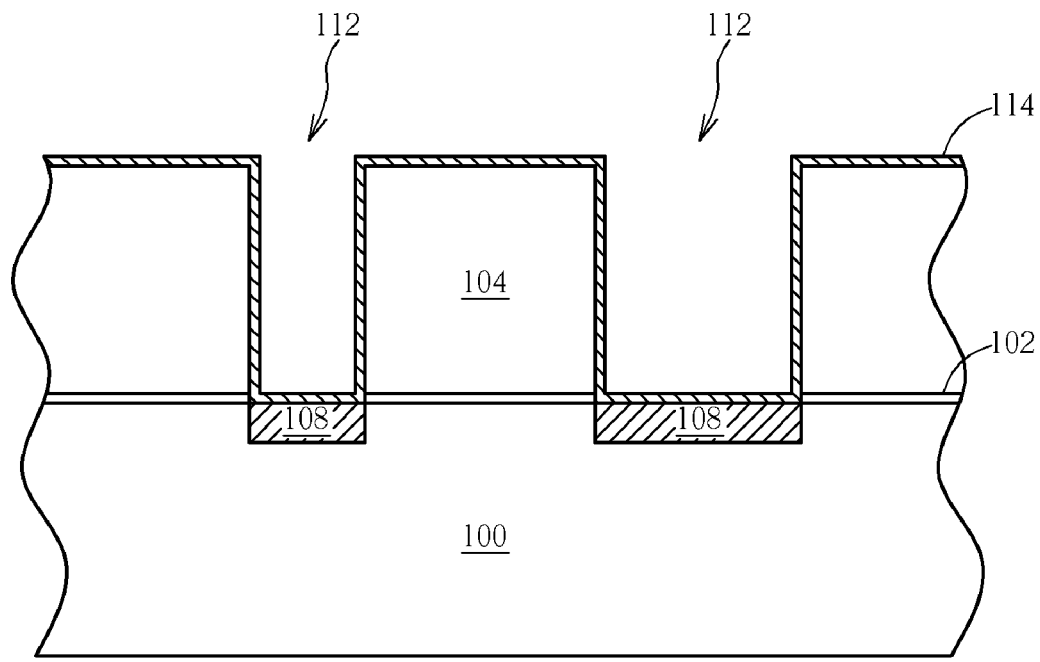
Figure 18:
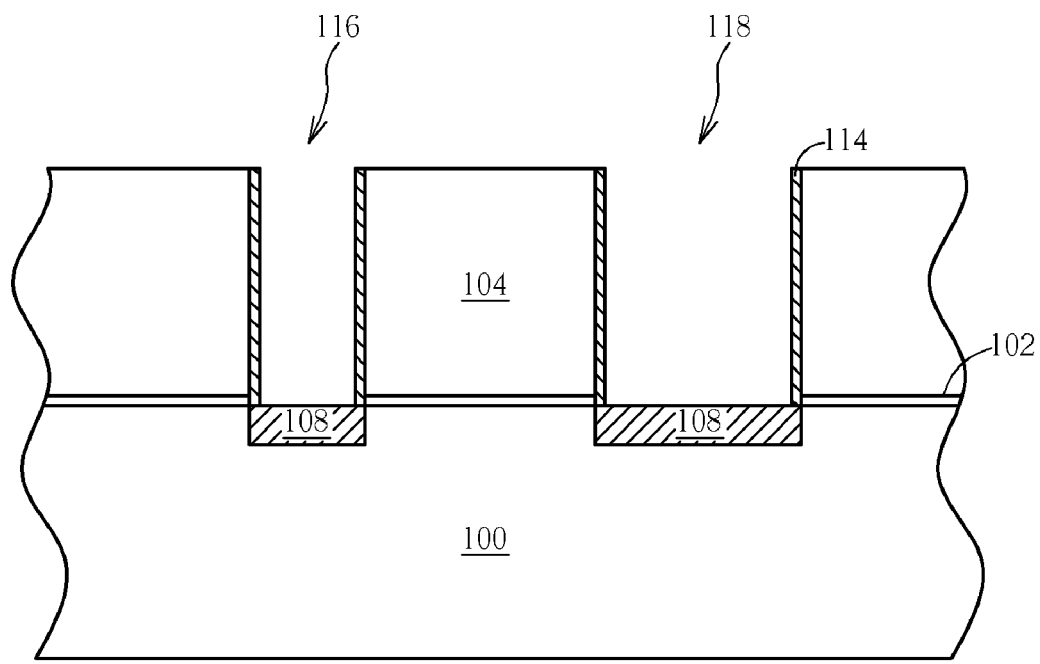

As shown in FIG. 16, an anisotropic etching process is performed using the mask layer 106 as an etching hard mask to etch away the dielectric layer 104 and the etch stop layer 12 form a plurality of openings 112 which expose the semiconductor substrate 100. As shown in FIG. 17, the mask layer 106 is removed, and a dielectric thin film 114 is deposited on the dielectric layer 104, the sidewalls of the openings 112, and the exposed semiconductor substrate 100. As shown in FIG. 18, an etch back process is performed to etch the dielectric thin film 114 disposed on the dielectric layer 104 and the exposed semiconductor substrate 100 to form a via hole 116 and a trench 118. It is appreciated that a clean process may be performed subsequent to removing the mask layer 106 and a surface treatment may be carried out when the via hole 116 and the trench 118 are formed. In addition, the materials of the etch stop layer 102, the dielectric layer 104, the mask layer 106, and the dielectric thin film 114 have been disclosed in the above-described embodiment, and thus are not redundantly described here.

Figure 19:
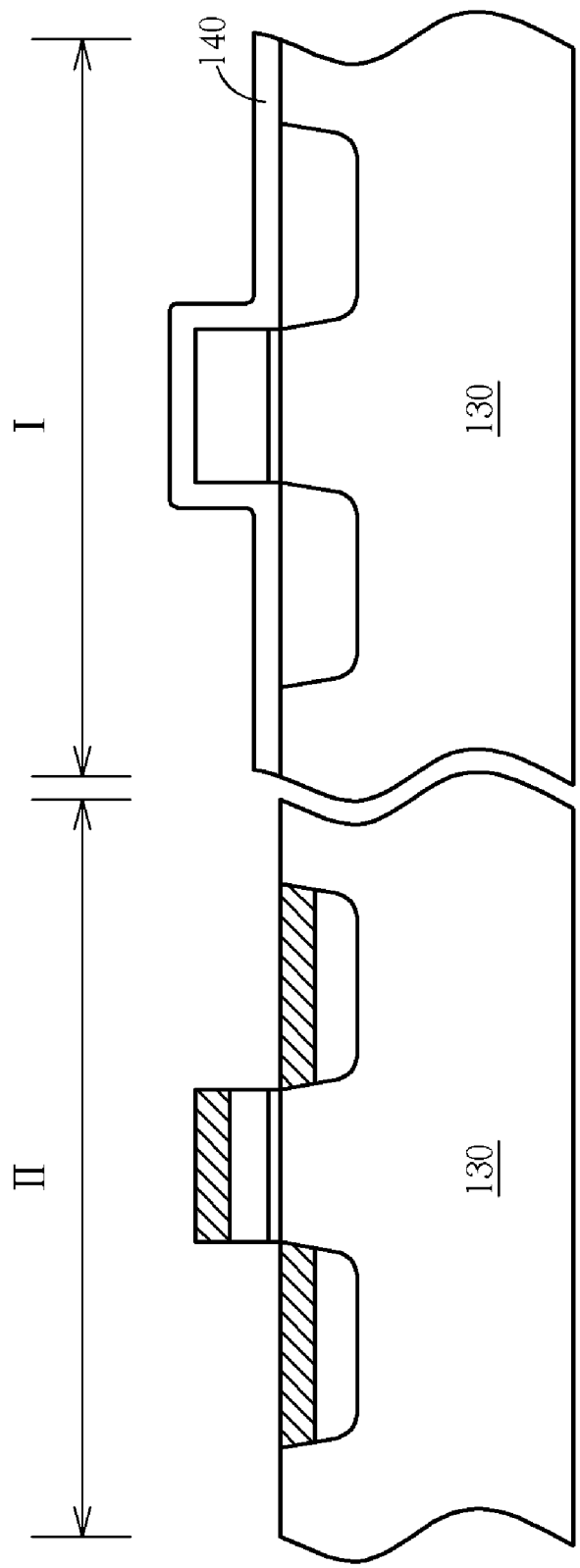
FIG. 19 is a schematic, cross-sectional diagram illustrating a method of forming openings according to still another preferred embodiment of the present invention.

Another benefit of the method of the present invention is the etch stop layer may be a salicide block (SAB). Please refer to FIG. 19. FIG. 19 is a schematic, cross-sectional diagram illustrating a method of forming openings according to still another preferred embodiment of the present invention. As shown in FIG. 19, a semiconductor substrate 130 is provided. The semiconductor substrate 130 is divided into a first device region I e.g. an ESD device region or a memory array region, and a second device region II e.g. a logic device region. Normally, the gate electrode and the source/drain regions of a logic device require salicides, while those of an ESD device or a memory device do not. Therefore, the first device region I is covered with an SAB 140 while performing a salicidation process. In this embodiment, the SAB 140 covering the first device region 140 can serve as the etch stop layer of the present invention. In such a case, the process step is reduced. It is to be noted that the steps of forming the openings have been clearly described in the aforementioned embodiments, and thus are not redundantly described here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating contact holes comprising:
providing a semiconductor substrate at least divided into a first device region and a second device region, the semiconductor substrate comprising an etch stop layer and at least a dielectric layer from bottom to top, the etch stop layer covering the first device region and exposing the second device region;
patterning the dielectric layer and the etching stop layer to form a plurality of contact holes in the dielectric layer and in the etching stop layer in the first device region and form a plurality of contact holes in the dielectric layer in the second device region, the contact holes formed in the first device region and in the second device region exposing the semiconductor substrate;
forming a dielectric thin film covering the dielectric layer, sidewalls of the contact holes, and the semiconductor substrate in the first device region and the second device region; and
removing the dielectric thin film disposed on the dielectric layer, and the semiconductor substrate.

2. The method of claim 1, wherein the etch stop layer comprises a salicide block (SAB).

3. The method of claim 1, wherein the dielectric thin film comprises a silicon oxide thin film, a silicon nitride thin film, or a silicon oxynitride thin film.

4. The method of claim 1, wherein the dielectric thin film comprises a tantalum oxide thin film, a titanium oxide thin film, a zirconium oxide thin film, a hafnium oxide thin film, hafnium silicon oxide thin film, or hafnium silicon oxynitride.

5. The method of claim 1, wherein the dielectric thin film comprises a high k material having a dielectric constant greater than 3.9.

6. The method of claim 1, wherein the contact holes have a dimension of between 50 and 100 nm, and the dielectric thin film has a thickness of between 0.5 to 10 nm.

7. The method of claim 1, further comprising performing a clean process prior to forming the dielectric thin film.

8. The method of claim 1, wherein patterning the dielectric layer and the etching stop layer is carried out by a mask layer together with at least an etching process, and the mask layer comprises a photoresist layer, a metal layer, or a dielectric layer.

9. The method of claim 1, further comprising performing a surface treatment subsequent to removing the dielectric thin film disposed on the dielectric layer and the semiconductor substrate.

10. The method of claim 9, wherein the surface treatment comprises an implantation process or a clean process.

* * * * *